United States Patent [19]
Wheatley, III et al.

[11] Patent Number: 5,530,928
[45] Date of Patent: *Jun. 25, 1996

[54] BALANCED DUAL MODE MIXER APPARATUS

[75] Inventors: Charles E. Wheatley, III, Del Mar, Calif.; Tohru Izumiyama, Soma, Japan; Tsuyoshi Kitamura, Soma, Japan; Mitsunari Okazaki, Soma, Japan

[73] Assignee: QUALCOMM Incorporated, San Diego, Calif.

[*] Notice: The term of this patent shall not extend beyond the expiration date of Pat. No. 5,483,696.

[21] Appl. No.: 446,128

[22] Filed: May 22, 1995

Related U.S. Application Data

[63] Continuation of Ser. No. 188,854, Jan. 31, 1994, Pat. No. 5,483,696.
[51] Int. Cl.⁶ .................................................. H04B 1/26
[52] U.S. Cl. ............................ 455/318; 455/326; 455/321
[58] Field of Search .................................... 455/326, 325, 455/313, 318, 319, 321, 323, 327, 328, 93

[56] References Cited

U.S. PATENT DOCUMENTS 4,080,573  3/1978  Howell ................................ 455/326 X

*Primary Examiner*—Chi H. Pham
*Assistant Examiner*—Philip J. Sobutka
*Attorney, Agent, or Firm*—Russell B. Miller; Roger W. Martin

[57] ABSTRACT

A balanced mixer is used as a switch. In digital mode, the balanced mixer receives a digital mode analog waveform and a local oscillator (L.O.). The balanced mixer mixes the waveform and the L.O. to provide a resultant output signal. In analog mode, the L.O. is modulated to contain the communication information. No analog signal is present on the port of the mixer which received the digital mode analog waveform in digital mode. The desired output of the mixer is the modulated L.O. In order to pass the L.O. through the mixer, a DC bias is applied to one of the waveform terminals of the mixer to unbalance it. A diode attenuator is added to the output of the mixer to provide scaling of the analog mode output.

5 Claims, 2 Drawing Sheets

1

BALANCED DUAL MODE MIXER APPARATUS

This is a continuation of application Ser. No. 08/188,854, filed Jan. 31, 1994, now U.S. Pat. No. 5,483,696.

BACKGROUND OF THE INVENTION

I. Field of the Invention

The present invention relates to analog circuits. More particularly, the present invention relates to a novel and improved analog switch comprising a balanced mixer.

II. Description of the Related Art

As emerging digital communication systems replace receding analog communication systems, a need arises for the user to be able to communicate using both analog and digital systems. The ability to communicate using both types of systems assures the user that service will be available to him if he is in an area having only an analog system or an area having only a digital system.

To have the ability to communicate using both types of systems, the equipment that the user has must support both types of communication systems. Providing dual mode service can be bulky, expensive, and power inefficient if separate circuits are used for each type of communication system. A more practical design uses as much circuitry as possible for operation in both types of communication systems.

By merging the digital mode circuits and the analog mode circuits at some intermediate point in the signal path, both the digital mode signal and analog; mode signal can pass through the same circuitry thus eliminating the need for redundant circuitry. For example, once merged the digital mode signal path and the analog mode signal path may share power control circuitry, RF upconversion circuitry, or power amplification circuitry.

Therefore the object of the present invention is to provide an inexpensive method of providing a coupling mechanism for dual mode equipment.

A further objective is to provide a switching mechanism using a balanced mixer.

SUMMARY OF THE INVENTION

The present invention is a novel and improved method and apparatus for using a balanced mixer as a switch. In digital mode, the balanced mixer receives a digital mode analog waveform, i.e. a digital information signal converted to analog form, and a local oscillator (L.O.) signal. The digital mode analog waveform carries the communication information and the L.O. provides the conversion frequency. The balanced mixer mixes the waveform and the L.O. to provide a resultant output signal.

In analog mode, the L.O. is a modulated carrier containing the communication information before it is presented to the mixer. No analog signal is present on the port of the mixer which received the digital mode analog waveform in digital mode. The desired output of the mixer is the modulated carrier. In order to pass the carrier through the mixer, a DC bias is applied to one of the small signal terminals of the mixer to unbalance it. The unbalanced mixer produces the carrier signal at an increased level at the output of the mixer.

The carrier output power of the unbalanced mixer configuration can vary from part to part. A diode attenuator is added to the output of the mixer to provide scaling of the analog mode output.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
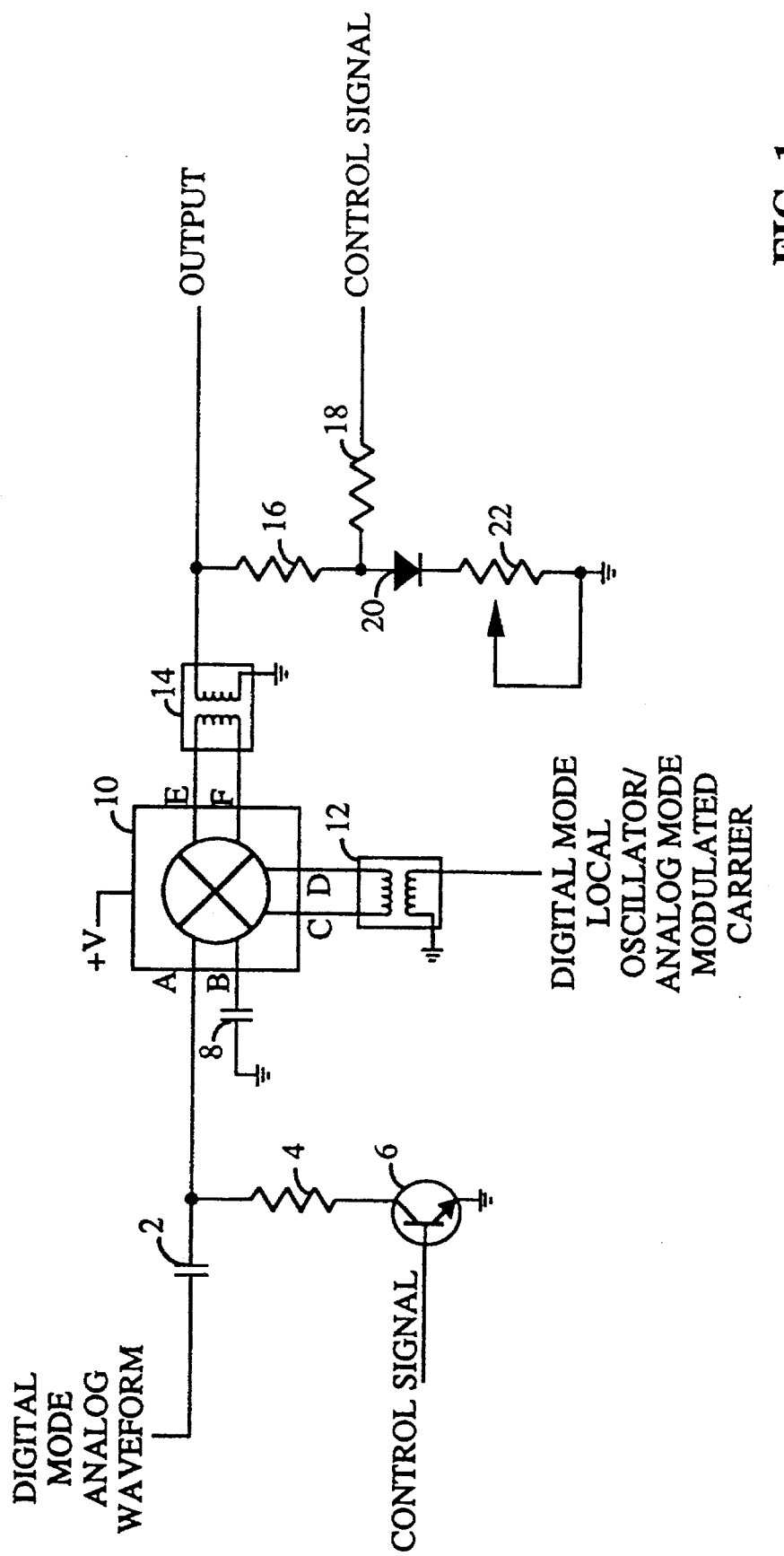
FIG. 1 is a schematic representation of the present invention.

The present invention is a method and apparatus for using a balanced mixer as a switch. FIG. 1 is an exemplary schematic showing the preferred embodiment of the present invention. In FIG. 1, mixer 10 is assumed to be an active double balanced mixer. The term double balanced mixer refers to the fact that the signal at both input ports of the mixer is suppressed from the output. Mixer 10 in an exemplary embodiment may be a NE602 sold by Signetics Company of Sunnyvale, Calif.

In a digital mode, the digital information waveform is generally produced by a digital to analog (D to A) converter. The digital mode analog waveform is applied to small signal input A of mixer 10 through capacitor 2. Mixer 10 has a DC bias level present on each input pin. Capacitor 2 blocks the DC voltage on input A from the digital mode analog waveform. Mixer 10 is set up to receive balanced inputs. In this case the small signal balanced input B has been connected to AC ground through capacitor 8 and a single ended signal is applied to the small signal input A through capacitor 2.

In the digital mode, the local oscillator (L.O.) signal is applied as a balanced signal to mixer 10 through transformer 12. Transformer 12 translates the single ended L.O. signal to balanced inputs C and D for mixer In the digital mode, the L.O. signal is ideally an unmodulated sine wave. In analog mode the L.O. signal is a modulated carrier.

In the digital mode outputs E and F of mixer 10 are the product of the digital mode analog waveform and the L.O. signal. Mixer 10 produces balanced output E and F which is translated to a single ended output by transformer 14. In digital mode, the control signal applied to resistor 18 and transistor 6 is a logically low level such that transistor 6 is off and has a high impedance relative to resistor 4. Likewise diode 20 is not biased and is a high impedance relative to resistor 16.

Figure 2:
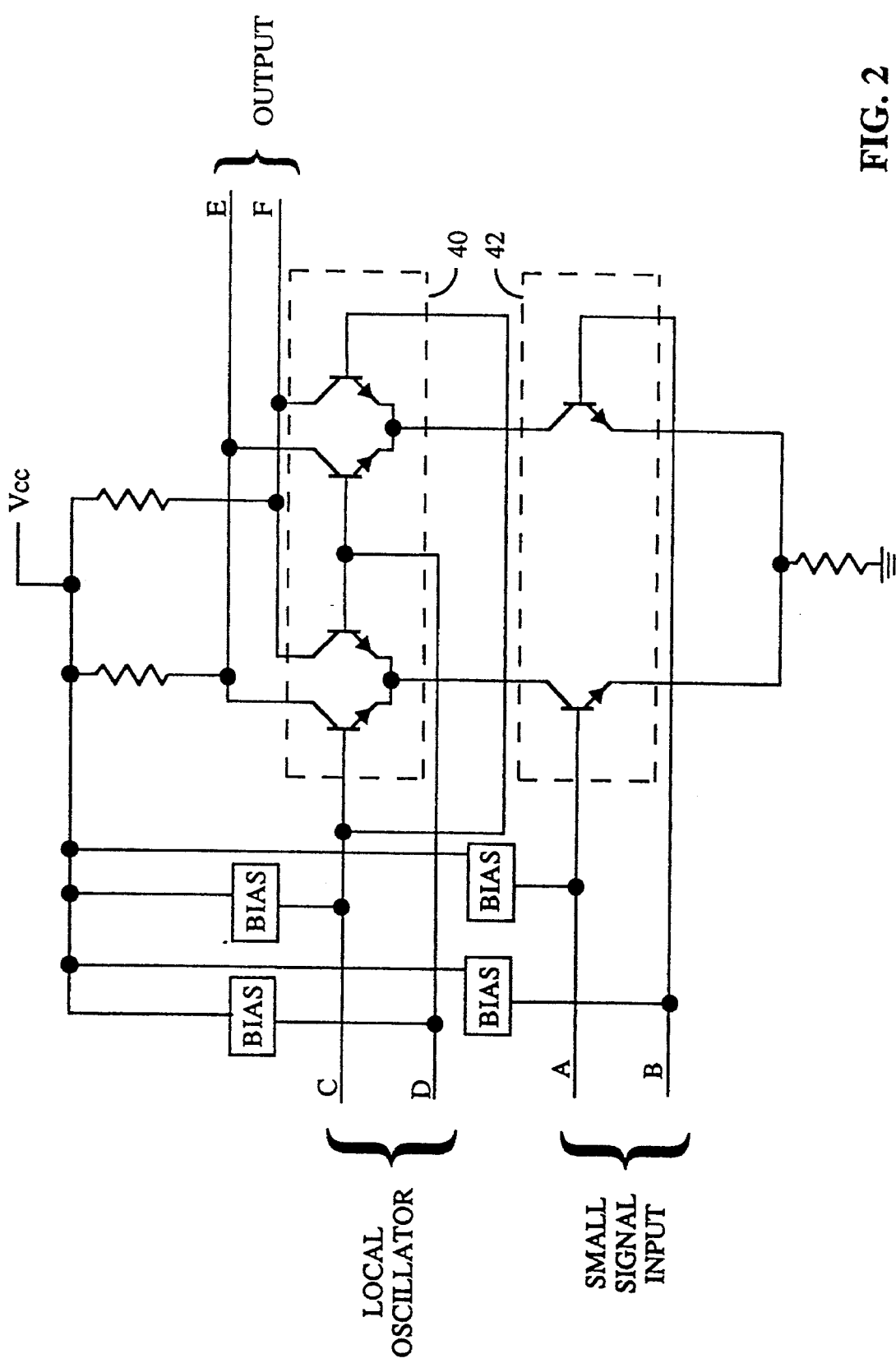
FIG. 2 is a schematic representation of a standard double balanced mixer.

FIG. 2 shows a typical balanced mixer configuration. The local oscillator is applied to the bases of four switching transistors 40 through inputs C and D. The strong local oscillator signal switches on and off four switching transistors 40. The small signal input A and B is applied to the bases of two transistors 42 having collectors coupled to the emitters of four switching transistors 40. The remainder of the circuit is used to bias the balanced mixer. The double ended output E and F of the mixer of FIG. 2 is taken from the collectors of four switching transistors 40.

When properly balanced, outputs E and F of the mixer have very small components at the L.O. frequency and the small signal input frequency. This suppression of the L.O. and small signal input is a direct result of the balanced arrangement and the summation of the signals at the collectors of four switching transistors 40. As the mixer becomes unbalanced, the L.O. and small signal frequency power levels increase at outputs E and F.

If the unbalancing of the mixer in FIG. 2 is taken to an extreme, the signal level at the L.O. frequency and the small signal frequency become significant. The present invention provides extreme unbalance such that the L.O frequency is available at the output at a usable level. The extreme unbalancing is achieved by disturbing the bias at the base of one of the two transistors 42 thus shutting off one of the transistors and unbalancing the mixer.

Referring again to FIG. 1, in the analog mode no signal is present on the digital mode analog waveform input. The L.O. is a frequency modulated (FM) carrier which contains the transmission information and is the desired output of mixer 10. The control signal is a logically high level. Transistor 6 is on and the bias blocked by capacitor 2 is shorted to ground through resistor 4 and transistor 6 thus unbalancing mixer 10. Transistor 6 also shorts any unwanted signal that might be present on the digital mode analog waveform input to ground. The modulated carrier passes at a large level through mixer 10 and transformer 14 to the output.

The actual level at the output of the modulated carrier in analog mode from transformer 14 is variable and dependent in part to variations of mixer 10 and the effects of the unbalanced state thereof. In order to provide uniform operation, the output level is selected by potentiometer 22. Because the control signal is at logic level high in analog mode, diode 20 is biased on through resistor 18. Potentiometer 22 is set to a resistive value to provide a consistent level at the output of transformer 14. The attenuator shown in FIG. 1 is an exemplary embodiment and a myriad of other embodiments for varying the amplitude of a signal are well known in the art. For example, the amplitude variation feature may be incorporated within the active balanced mixer.

In this way all circuitry from the output of transformer 14 to the output of the radio can be common for both digital and analog operation. Mixer 10 and the control signal provide an inexpensive and effective means of coupling the dual mode operation circuitry The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A dual mode communication device having a digital mode and an analog mode, the communication device having a dual mode mixer circuit coupled to a local oscillator signal in the digital mode and to a modulated signal in the analog mode, the dual mode mixer circuit comprising:

an active balanced mixer having a first input, a second input, and an output;

a first coupling device for coupling the local oscillation signal to the first input in the digital mode and coupling the modulated signal to the first input in the analog mode;

a second coupling device for coupling the information signal to the second input; and an unbalancing circuit coupled to the active balanced mixer and a control signal, the control signal designating the digital mode or the analog mode, the active balanced mixer being unbalanced in response to the control signal indicating the analog mode.

2. The device of claim 1 wherein the second input of the active balanced mixer has a bias level and the unbalancing circuit corrupts the bias level.

3. The device of claim 1 wherein the active balanced mixer mixes the information signal and the local oscillation signal in the digital mode.

4. The device of claim 1 wherein the unbalancing circuit causes the modulated signal to be coupled through the active balanced mixer to the output in the analog mode.

5. The device of claim 1 and further including an attenuator coupled to the active balanced mixer output for varying the amplitude of the modulated signal.

* * * * *